United States Patent [19]

Oliver

[11] 4,244,032
[45] Jan. 6, 1981

[54] APPARATUS FOR PROGRAMMING A PROM BY PROPAGATING DATA WORDS FROM AN ADDRESS BUS TO THE PROM DATA TERMINALS

[76] Inventor: Douglas E. Oliver, 1143 N. Poinsettia Dr., Los Angeles, Calif. 90046

[21] Appl. No.: 861,186

[22] Filed: Dec. 16, 1977

[51] Int. Cl.³ .................... G06F 13/00; G11C 7/00
[52] U.S. Cl. .................................................. 364/900
[58] Field of Search ... 364/900 MS File, 200 MS File, 364/716; 365/94, 96; 340/147 R, 147 P, 149 A, 166 R

[56] References Cited

U.S. PATENT DOCUMENTS

| | | | |
|---|---|---|---|
| 3,798,612 | 3/1974 | Struger et al. | 364/900 |
| 3,813,649 | 5/1974 | Struger et al. | 364/900 |
| 3,835,458 | 9/1974 | Mrazek | 365/94 X |
| 3,876,982 | 4/1975 | Morrien | 340/147 P |
| 3,938,104 | 2/1976 | Henry et al. | 364/900 |
| 3,944,984 | 3/1976 | Morley et al. | 364/900 |
| 3,975,622 | 8/1976 | Horn et al. | 364/900 X |
| 3,993,980 | 11/1976 | Moreton | 364/200 |
| 4,020,469 | 4/1977 | Manning | 364/900 |
| 4,093,998 | 6/1978 | Miller | 364/900 |
| 4,156,926 | 5/1979 | Hartman | 364/900 |

OTHER PUBLICATIONS

"Programming Information Bulletin 1750—Programmable Matrix Controller," Allen—Bradley Systs. Div., Highland Heights, Ohio, 1971.
"All—Purpose Controller May Be Externally Programmed" In *Canadian Electronics Engineering*, vol. 18, No. 3, pp. 24-25, Mar. 1974.
"Program Erasable PROMS on the Board," in *Electronic Design*, Jun. 7, 1976, vol. 24, No. 12, pp. 148-150.
"An Intelligent PROM Programmer" in *Electronics*, May 29, 1975, p. 98.
Kerber, R.J., "Build A PROM Programmer And Program Your Own Devices", in *Electronic Design*, vol. 24, No. 22, Oct. 25, 1976, pp. 172-176.
"A Programming Controller for the 2708 EPROM Copies Data In-Circuit", in *Electronic Design*, vol. 25, No. 8, Apr. 12, 1977, p. 148.

*Primary Examiner*—Melvin B. Chapnick
*Attorney, Agent, or Firm*—Christie, Parker & Hale

[57] ABSTRACT

An adapter converts an instruction-controlled processor such as a microprocessor into a PROM programming apparatus. The adapter is compatible with the type of processor having readout circuitry for applying a multibit signal via an internal address bus to a processor socket into which an addressable memory such as an already programmed PROM is inserted for normal processor operation. During a programming operation, the processor socket does not contain a PROM; instead, the adapter is connected between the processor socket and a PROM being programmed. Control circuitry in the adapter receives the multibit signal so as to control the entering of a plurality of data words into the PROM.

8 Claims, 7 Drawing Figures

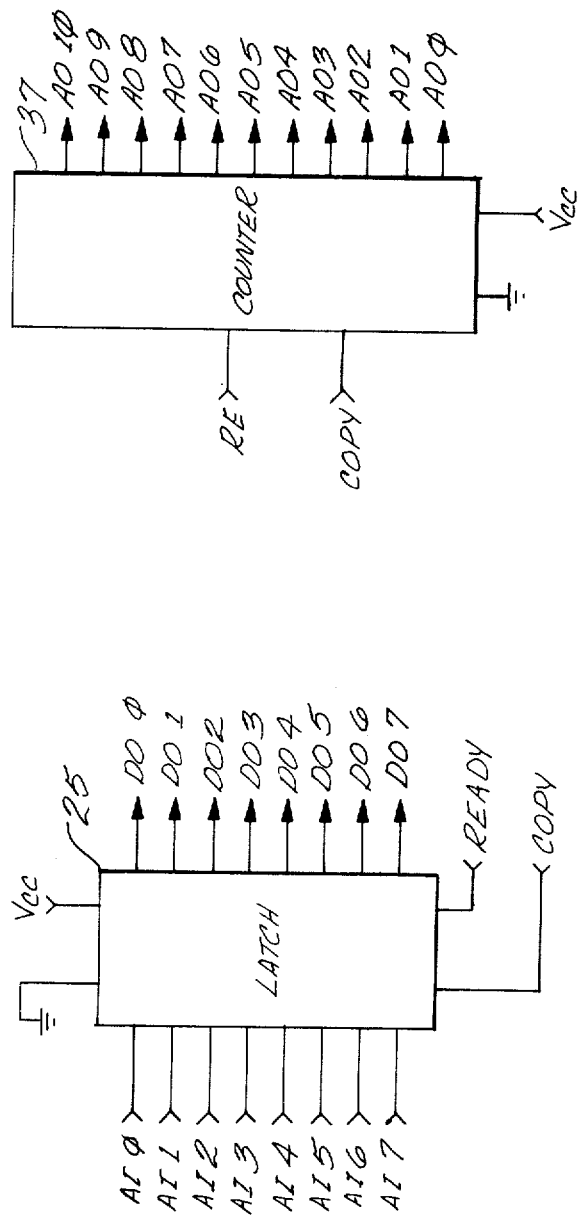
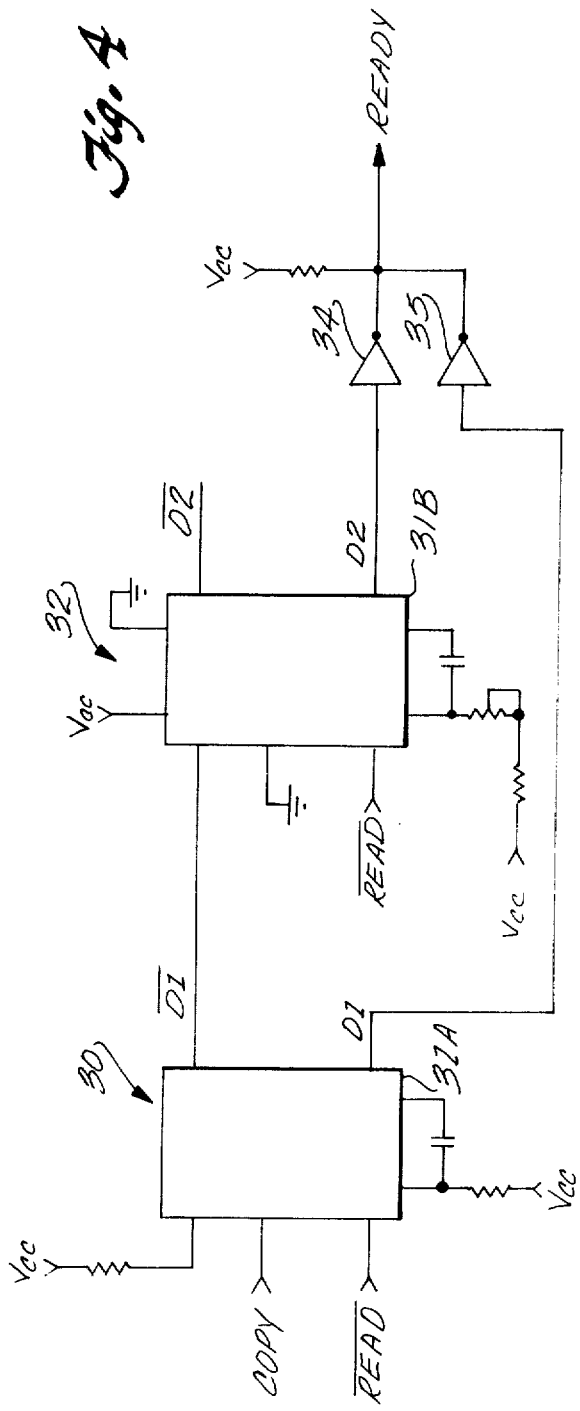
Fig. 4

APPARATUS FOR PROGRAMMING A PROM BY PROPAGATING DATA WORDS FROM AN ADDRESS BUS TO THE PROM DATA TERMINALS

BACKGROUND OF THE INVENTION

In general, my invention relates to data processing systems. More particularly, it relates to apparatus for entering data words into a particular type of addressable memory, called a programmable read only memory (PROM), used in such data processing systems.

There are various type of addressable memories, some of which are classified as random access memories (RAMs) and others of which are classified as read only memories (ROMs). A ROM has utility in a wide range of data processing applications. Such devices have been used in many different types of instruction-controlled processors including special purpose sequencers and controllers and also including general purpose processors such as microprocessors. For many years, various semiconductor manufacturers have made and sold for use in such applications programmable read only memories (PROMs) that are programmed by means of a burn out technique. More recently, they have made and sold PROMs that are erasable. A representative example is a PROM made and sold by Texas Instruments Incorporated under the designation TMS 2716 JL. This particular PROM has 2048 locations each providing for the storage of an 8-bit data word, and is ultra-violet light erasable.

The various manufacturers of PROMs follow an industry-wide packaging convention, as they do for integrated circuits in general, to ensure both interchangeability and compatibility with standard sockets. Thus, a PROM supplied by any one of several manufacturers is contained in a standard dual-in-line package, most typically having 24 pins or terminals. One group of the terminals defines a set of address terminals. Another group of the terminals defines a set of data terminals. Another group of the terminals is provided so that operating power can be applied to the device. Finally, at least one of the terminals is used as a program control terminal. For a PROM that is programmable by means of the burn out technique, programming operation proceeds one bit at a time and a selected one of the data terminals is used as the program control terminal. For a PROM that is erasable, programming operation can proceed a data word at a time, and a terminal separate and apart from the data terminals is used as the program control terminal.

A need exists for a simple, easy to use, and inexpensive apparatus for high speed programming of such PROMs. Prior efforts directed toward this need have failed to provide reasonably satisfactory apparatus. Generally, the complexity involved in prior art PROM programmers, and the inevitable cost attending such complexity, makes them too expensive for many individuals and companies who want such programmers.

When I began to direct efforts toward this need, I did so with a view toward eliminating duplication of parts. I have reasoned that inasmuch as most, if not all, potential users of PROM programming apparatus already have in their possession equipment containing circuitry capable of performing a number of the various functions that are carried out by a PROM programming apparatus, it would be advantageous to tap such circuitry by providing an adapter to convert such existing equipment into a PROM programmer.

My invention, as is more fully developed below, not only taps such circuitry but also causes certain circuitry provided for implementing a reading function to play a role in a new function of entering data words into a PROM.

SUMMARY OF THE INVENTION

In accordance with my invention, an adapter converts an instruction-controlled processor into a PROM programming apparatus.

The instruction-controlled processor used in connection with the adapter can be, for example, a general purpose microprocessor. Equally, it can be a special purpose device such as a sequencer or a controller. In any case, the processor includes processor socket means for receiving a memory such as a PROM, an internal address bus connected to the processor socket means, and reading means for causing the internal address bus to carry a multibit signal, the encoding of which in normal processor operation is such as to define an address each time the processor executes a predetermined instruction such as a read instruction.

The adapter comprises an adapter input for connecting the adapter to the processor, the adapter input including adapter plug means for insertion into the processor socket means so that the multibit signal is received by the adapter from the internal address bus. The adapter further includes adapter socket means into which a PROM is inserted for the programming operation, and control circuit means for entering a plurality of data words into such inserted PROM.

One of the advantages arising from what has so far been stated about my invention is the elimination of the need for certain circuitry contained in prior art PROM programmers to provide operating power. In particular, it will be appreciated that the processor, in order to carry out its normal operation, applies power supply voltages to the processor socket. Inasmuch as the adapter is connected to the processor socket, it receives these power supply voltages and there is therefore no need to duplicate such circuitry as rectifiers, voltage regulators and the like.

Other significant advantages of the adapter will be appreciated upon consideration of the control circuit means of the adapter. The control circuit means includes addressing means connected to the adapter socket means for controlling the set of address terminals of the PROM being programmed. In one embodiment of the invention, the addressing means comprises a counter and means for stepping the counter to cause it to generate a sequence of addresses. In another embodiment, the addressing means comprises an adapter address bus connected between the adapter plug means and the adapter socket means. In this other embodiment, the addressing means forms part of a signal sorting or de-multiplexing arrangement causing alternate ones of the addresses defined by the processor to be applied to the set of address terminals. In either embodiment, the addressing means ensures that each of the plurality of data words is entered into a separate location of the PROM.

The control circuit means further includes signal propagating means connected between the adapter plug means and the adapter socket means for controlling the set of data terminals of the PROM in response to the multibit signal received from the internal address bus.

This is a particularly advantageous feature of my invention. In particular, it will be appreciated that the processor, in order to carry out normal memory reading operations, has multibit-signal source circuitry that applies the multibit signal to the internal address bus. In contrast, a processor internal data bus used in such memory reading operations need not be connected to such source circuitry, this is so because in normal operation its source of information (i.e., data words) is the addressable memory normally contained in the processor socket means. In short, the adapter causes such address source circuitry provided for implementing a reading function to play a role in a new function of entering data words into a PROM, and, by virtue of doing so, is substantially simpler in construction than prior art PROM programmers.

The control circuit means further includes pulse generating means for controlling the program control terminal of the PROM. Preferably, the pulse generating means includes an inverter powered by power supply voltages tapped from the processor.

The foregoing and other features and advantages of my invention will be better understood following a consideration of the detailed description set forth below.

BRIEF DESCRIPTION OF THE DRAWINGS

FIG. 4 is a block and schematic diagram showing various integrated circuits employed in the addressing means and the signal propagating means of the first embodiment;

DETAILED DESCRIPTION

Figure 1:
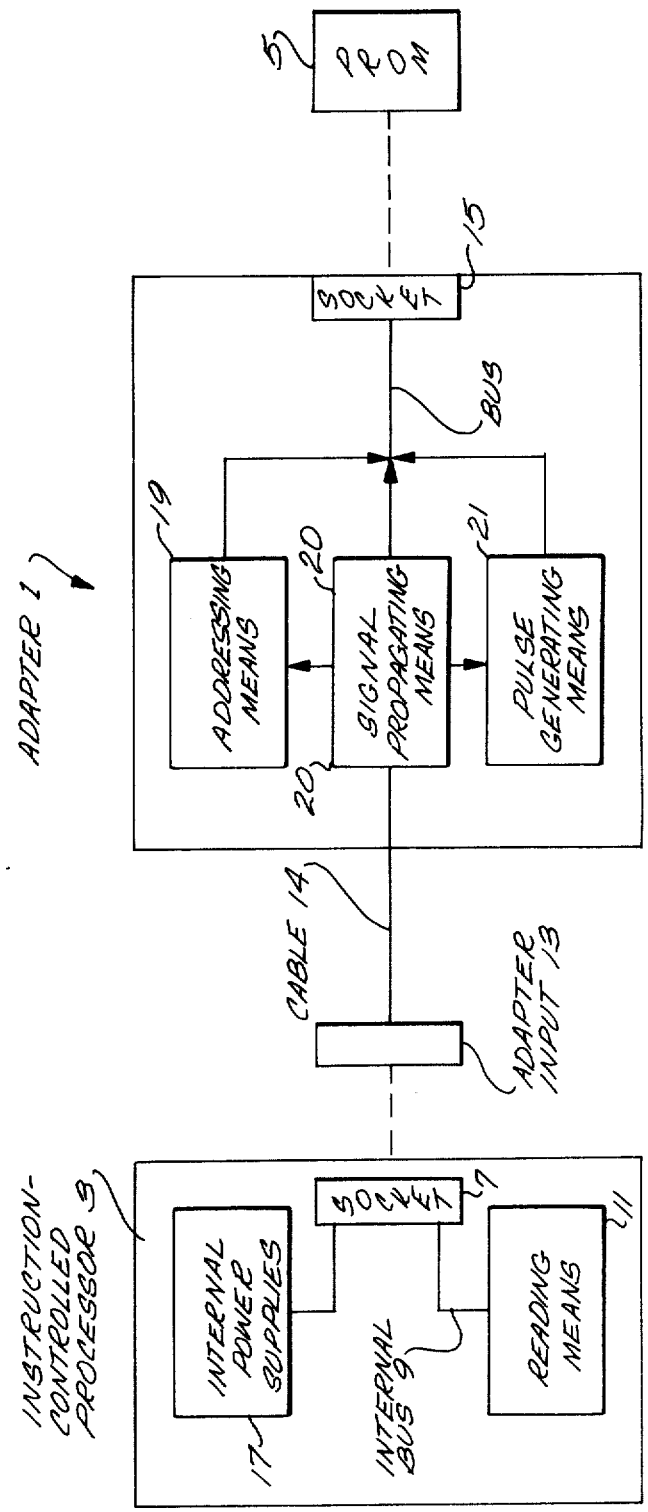
FIG. 1 is a block diagram showing an adapter according to the invention connected between an instruction-controlled processor and a PROM.

In the block diagram of FIG. 1, an adapter 1 is shown between an instruction-controlled processor 3 and a PROM 5. Adapter 1 is used in connection with processor 3 to form an apparatus for carrying out a programming operation to program PROM 5.

Adapter 1 is compatible with various types of instruction-controlled processors including special purpose devices such as sequencers and controllers, and including general purpose devices such as microprocessors. In any case, processor 3 includes a processor socket 7 normally used to receive an addressable memory (not shown) such as an already programmed PROM. Processor 3 further includes an internal bus 9 connected to socket 7, and reading means 11 for causing an address bus portion (not separately shown in FIG. 1) of bus 9 to carry a multibit signal, the encoding of which is such as to define an address each time processor 3 executes a predetermined instruction such as a read instruction, a move instruction, or the like.

Adapter 1 comprises an adapter input 13 for connecting adapter 1 to processor 3. Adapter input 13 is connected to control circuitry, preferably by cable 14, a 26-conductor flat ribbon cable. Preferably, the control circuitry is contained in a generally box-shaped housing (not shown) that supports an adapter socket 15. Preferably, socket 15 is a conventional zero insertion-force socket and is pin-compatible with a standard 24 pin dual-in-line package. This is the same type of socket typically used as socket 7 in processor 3 in circumstances in which the addressable memory normally used therein is an already programmed PROM. In such circumstances, the internal address bus portion of bus 9 has at least ten conductors, and a data bus portion (not separately shown in FIG. 1) has eight conductors. Also in such circumstances, internal power supplies 17 are connected to socket 7 so that standard operating voltages, usually designated as $V_{DD}$, $V_{CC}$, $V_{BB}$, and $V_{SS}$, can be applied to the appropriate pins of such an already programmed PROM.

The control circuitry contained within adapter 1 includes addressing means 19. Alternative arrangements of addressing means 19 are described more fully below. In any case, addressing means 19 operates during a programming operation to ensure that each of a plurality of data words are entered into a separate location of PROM 5. The control circuitry further includes signal propagating means 20 connected between cable 14 and socket 15 for controlling the set of data terminals of PROM 5 in response to the multibit signal received from the internal address bus of processor 3. The control circuitry further includes pulse generating means 21 that is also connected to socket 15 to provide a control signal to PROM 5.

Figure 2:
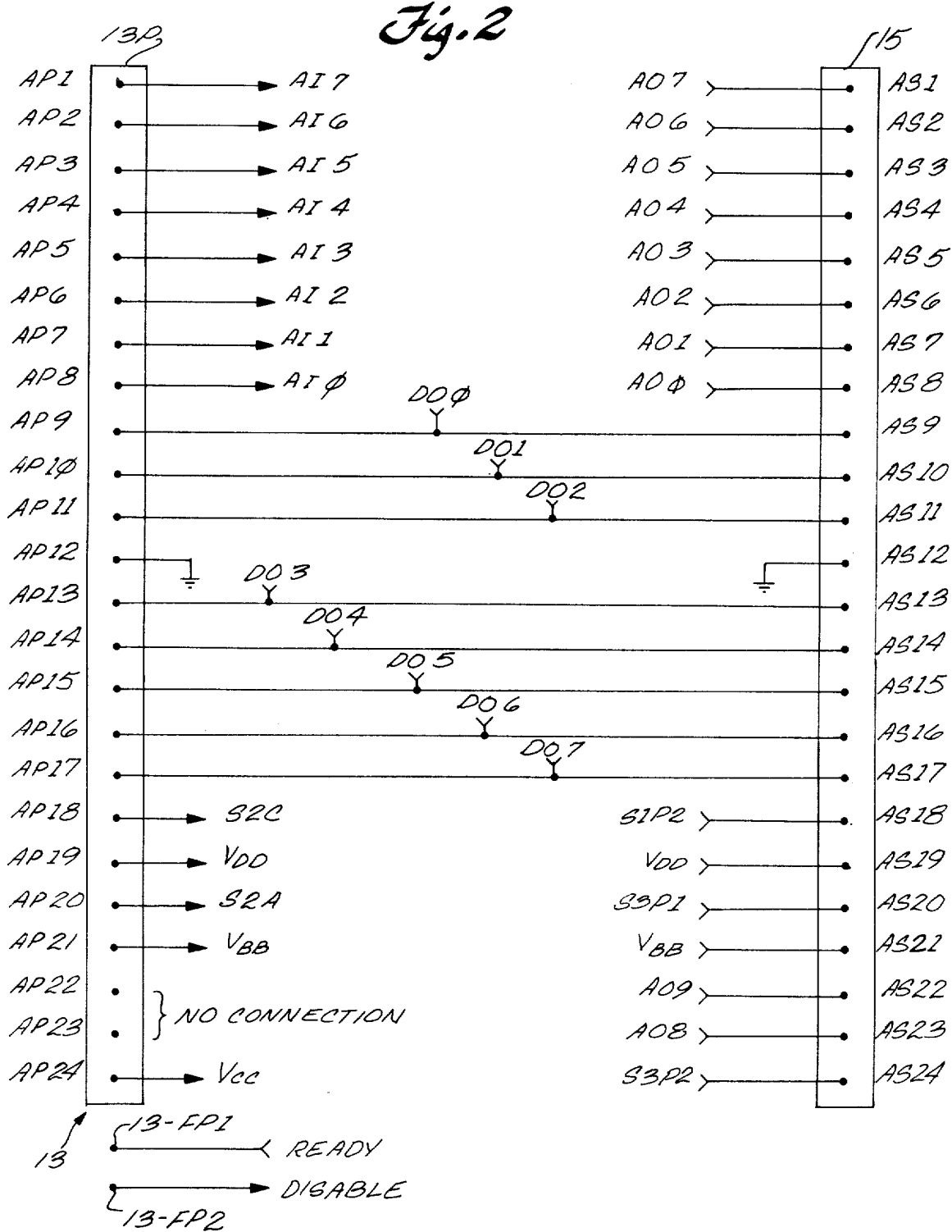
FIG. 2 is a schematic diagram showing, with respect to a first embodiment of the invention, various signal leads and their connection to the adapter input and the adapter socket.

As shown in detail in FIG. 2, adapter input 13 includes in a specific embodiment a 24 pin plug 13P and two free pins 13-FP1 and 13-FP2. Before proceeding further with a description of the two free pins, the following background points bear mention. Each of a considerable number of processors with which adapter 1 is compatible includes, in addition to socket 7, one or more other sockets that are connected to internal bus 9. This circumstance can exist, for example, in a general purpose microprocessor such as one using the well known 8080 integrated circuit processor chip which is manufactured by various semiconductor manufacturers including Intel. In the operation of such an 8080-based microprocessor, it is possible for reading means 11 to apply to socket 7 all the signals that in combination effect a readout of a location in a PROM inserted in socket 7 even though a data word from another memory is being retrieved. To prevent interference, there is generated within the processor a control signal, usually called either an "EN signal" or a "DISABLE signal," that selectively inhibits certain data buffer circuits. Free pin 13-FP2 is provided so that when adapter 1 is used with such a microprocessor the DISABLE signal can be tapped.

As for free pin 13-FP1, this is provided so that when adapter 1 is used with such a microprocessor a connection can be made to an internal signal lead, usually called a "Ready bus," that is used to carry a timing and control signal for coordinating the operation of a memory with the remaining circuitry in the processor. While the Ready signal is false during a normal memory read operation, the processor halts all other operations pending retrieval of the desired data word. The Ready signal becomes true in such normal operation to signal the fact that the data word has been retrieved and applied to the internal data bus.

As for adapter plug 13P, its pins are referred to herein as AP1 through AP24. While adapter plug 13P is in socket 7, pin AS12 receives $V_{SS}$, i.e., ground; pin AS19 receives $V_{DD}$, typically +12 volts; pin AS21 receives $V_{BB}$, typically −5 volts; and pin AS24 receives $V_{CC}$, typically +5 volts. Also, pins AS9–AS11 and AS13–AS17 are connected to the data bus portion of internal bus 9. An eight conductor adapter data bus connects these pins to adapter socket 15 as shown in FIG. 2. The connection of the adapter data bus between plug 13P and socket 15 is provided for carrying signals read out from PROM 5 after it has been programmed so as to conduct a verification test. During a programming operation, the data words being entered into PROM 5 are applied to the adapter data bus via signal leads referred to herein as DO$\phi$ through DO7. As is described more fully below with reference to FIG. 4, an integrated circuit 25 has an eight bit parallel output connected to signal leads DO$\phi$ through DO7. Its input, likewise eight bit parallel, is connected via signal AI$\phi$ through AI7 which are connected to plug 13P as shown in FIG. 2. As will be explained more fully below, integrated circuit 25 is controlled such that it performs a signal propagating function whereby the multibit signal used in normal operation of processor 3 to define a sequence of addresses is employed in the programming operation to define a sequence of data words entered into the locations of PROM 5.

Figure 3:
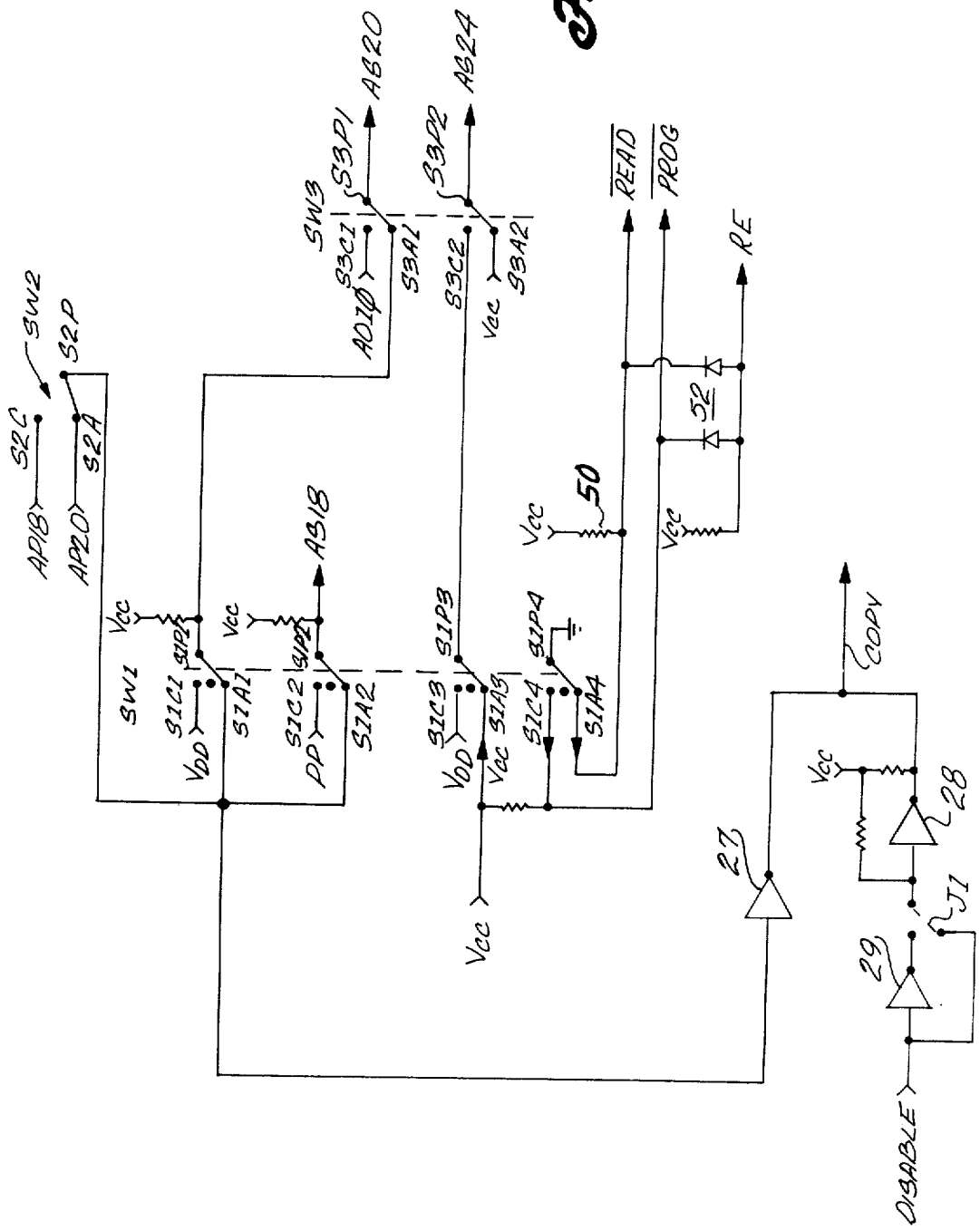
FIG. 3 is a block and schematic diagram mainly showing various mode switches and their connection to the signal leads shown in FIG. 2.

With reference to FIG. 3, there will now be described certain manually controlled toggle switches that are preferably included in adapter 1. One such switch, generally indicated as SW1, is a four pole, triple throw switch. It is shown in FIG. 3 in a first position, used for placing adapter 1 in a read mode which is used for verification testing. While in a second position, switch SW1 places adapter 1 into a standby mode. While in a third position, switch SW1 places adapter 1 into a programming mode.

Another such switch, SW2, is a single pole, double throw switch, and the remaining switch, SW3, is a double pole, double throw switch. These two switches are provided because there are minor differences in pin assignments between different types of PROMs with which the specifically described embodiment is compatible. For example, an 8K PROM such as a TMS 2708 PROM, which contains 1024 addressable locations each having 8 bits, uses its pins 18, 20, and 24 in a different way from the corresponding pins of a 16K PROM such as a TMS 2716 PROM, which contains 2048 addressable locations each likewise having 8 bits. A side by side depiction of the pin assignments for these two PROMs is given in one of Texas Instruments' Applications Briefs, authored by David H. Sitrick, and dated March, 1977.

In circumstances in which processor socket 7 is normally used to receive an 8K PROM, the proper position for switch SW2 is the one shown in FIG. 2 such that its pole S2P is connected via its contact S2A to AP20. In such circumstances, reading means 11 causes a chip select ($\overline{CS}$) signal, applied to pin 20 of socket 7, to become false each time a data word is to be read from such an 8K PROM. In circumstances in which PROM 5 is an 8K PROM, the proper position for switch SW3 is the one shown in FIG. 3 such that each of its A contacts is connected to its corresponding pole. In such position, contact S3A1 is connected via pole S3P1 to AS20. Thus, while adapter 1 is connected at its input to a processor having a socket for an 8K PROM, and is connected at its output to an 8K PROM, the processor generated chip select signal is applied to pin 20 of PROM 5 during verification testing.

In circumstances in which processor socket 7 is normally used to receive a 16K PROM, the proper position for switch SW2 is such that its pole S2P is connected via its contact S2C to AP18. In such circumstances, the processor generated chip select signal appears on pin 18 of socket 7. Thus, while adapter 1 is connected at its input to a processor having a socket for a 16K PROM, and is connected at its output to an 8K PROM, the processor generated chip select signal is conducted from AP18 to AS20 for application to pin 20 of PROM 5 during verification testing.

In circumstances in which PROM 5 is a 16K PROM, the proper position for switch S3 is such that each of its C contacts is connected to its corresponding pole. In such position, pole S3P2 forms part of a conduction path for applying $V_{CC}$ to pin 24 of PROM 5 during verification testing. As to the conduction path for the chip select signal, this involves pole S1P2 which is connected to AS18. While adapter 1 is connected at its input to a processor having a socket for a 16K PROM, and is connected at its output to a 16K PROM, the processor generated chip select signal is conducted from AP18 through contact S2C, pole S2P, contact S1A2, pole S1P2, and AS18 to pin 18 of PROM 5 during verification testing. While adapter 1 is connected at its input to a processor having a socket for an 8K PROM, and is connected at its output to a 16K PROM, the processor generated chip select signal is conducted from a different starting point, viz., AP20 and contact S2A, but otherwise the same path is involved to pin 18 of PROM 5 during verification testing.

The processor generated chip select signal is also applied to the input of an inverter 27. The output of inverter 27 is directly connected to the output of an inverter 28 in a conventional "wired-AND" configuration. The input of inverter 28 is connected by a jumper J1 either to the input or to the output of an inverter 29. The processor generated Disable signal, which is received via free pin 13-FP2, is applied to the input of inverter 29. In some processors, the Disable signal is normally true and is false during memory reading operations; in others, it is normally false and is true during such memory reading operations. Jumper J1 is appropriately connected so that the input to inverter 28 is normally true. For convenience in describing the operation of the adapter, the Disable signal is hereinafter deemed to be normally true.

A signal referred to herein as "Copy" is produced at the interconnected outputs of inverters 27 and 28. The Copy signal is normally false and is true only when both the Disable and chip select signals are false.

The Copy signal is applied to several circuits including latch circuit 25 (FIG. 4). Suitably, latch circuit 25 is an SN 74LS374 eight bit latch circuit manufactured by Texas Instruments. Another circuit shown in FIG. 4 to which the Copy signal is applied is a monostable 30. Suitably, there is provided an integrated circuit such as a 74LS221 having identical halves 31A and 31B that are connected in tandem as shown in FIG. 4 to define monostable 30 and a monostable 32. Each monostable has a clear input to which a $\overline{\text{READ}}$ signal is applied. This signal is received from contact S1A4 (FIG. 3).

An inverter 34 and an inverter 35 are connected together in the wired AND configuration to produce the Ready signal in response to D1 and D2 output signals produced by monostables 30 and 32. As indicated by the timing diagram shown in FIG. 7, each of the signals D1, D2 and Ready defines a pulse waveform during a programming operation. In particular, when at T1 a negative edge occurs in the Copy signal, monostable 30 is triggered causing the signal D1 to change from false to true. At time T2, the first monostable period expires causing the signal D1 to change back to false. The complementary signal $\overline{\text{D1}}$ (not shown in FIG. 7) accordingly has a positive edge at time T2 and this triggers monostable 32 causing the signal D2 to change from false to true. At time T3, the second monostable period expires causing the signal D2 to change back to false. The Ready signal is false throughout the period between T1 and T3.

Figure 5:
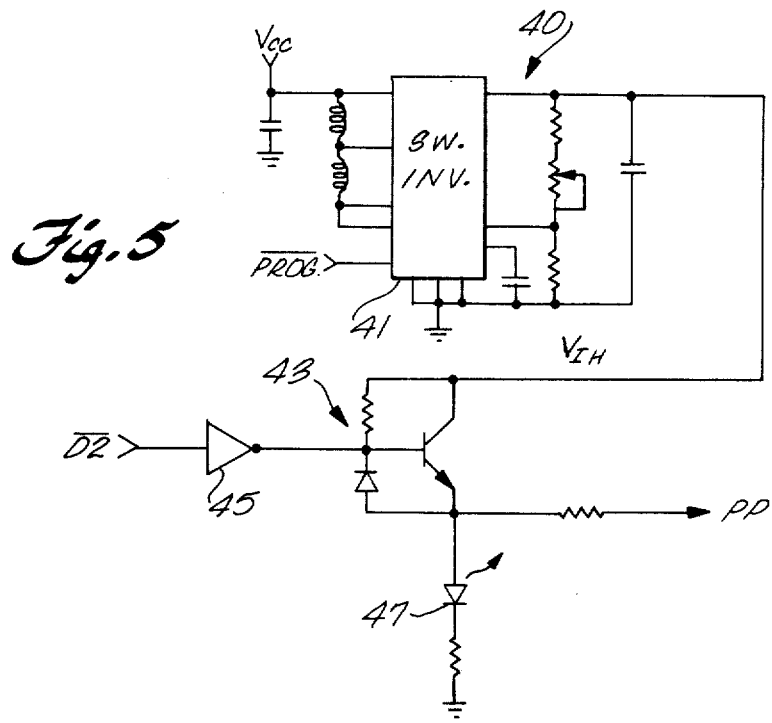
FIG. 5 is a block and schematic diagram showing circuits employed in the pulse generating means of the first embodiment.
Figure 7:
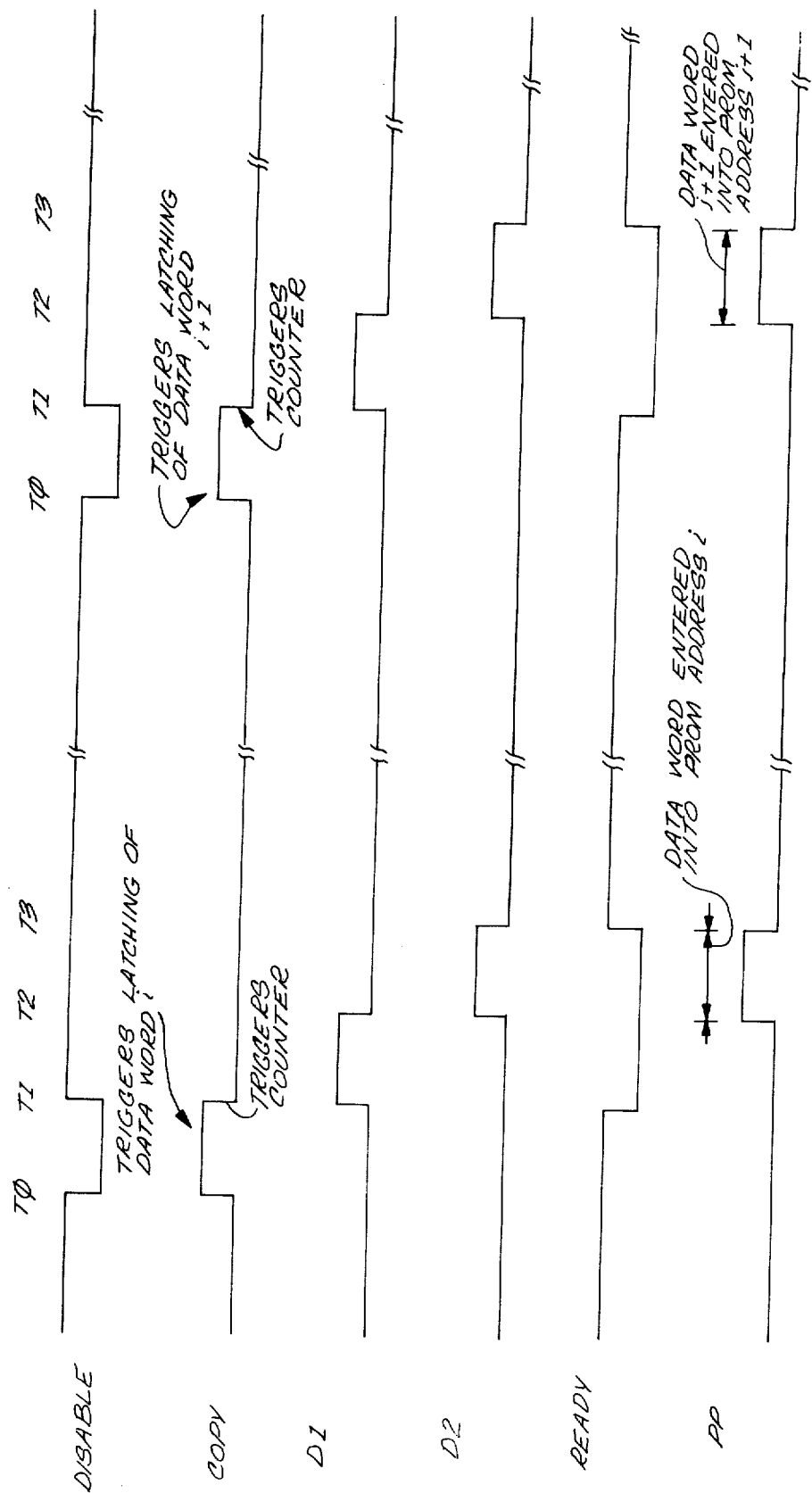
FIG. 7 is a timing diagram.

Another circuit shown in FIG. 4 to which the Copy signal is applied is counter 37. Suitably, counter 37 is a 4040 integrated circuit. In response to each negative edge of the Copy signal, counter 37 steps to an incrementally different count. Its output is an eleven bit wide parallel signal which is applied to signal leads AO$\phi$ through AO1$\phi$. These signal leads are connected to adapter socket 15 as shown in FIG. 2. In FIG. 5 there is shown circuitry involved in generating a program pulse (PP) signal. This circuitry includes a d.c. to d.c. converter 40. Suitably, converter 40 includes an integrated circuit switching inverter 41 such as a TL497. The output voltage of converter 40, designated herein as V$_{IH}$, is preferably +27 volts, and is used to provide operating power for a buffer circuit 43. An inverter 45 drives buffer circuit 43 in response to the $\overline{\text{D2}}$ signal produced by monostable 32 (FIG. 4) with the result that a train of positive pulses is defined by the PP signal as shown in FIG. 7. Preferably, an LED 47 is incorporated in buffer circuit 43 so that a visual indication is given that programming is in progress.

To summarize and amplify somewhat on what has already been described as to operation, there will now be described an example in which adapter 1 is used in connection with an 8080 based microprocessor.

Preliminarily, the microprocessor receives information as to the plurality of data words that are to be entered into PROM 5. In circumstances in which it is desired to cause PROM 5 to be a duplicate of an already programmed PROM, such already programmed PROM can be inserted into adapter socket 15, and be read out so that the data words therein are copied into the processor's working memory. A fresh PROM may then be inserted into socket 15, and programmed in the same manner as described above.

The microprocessor further receives a set of instructions that upon execution cause it to retrieve the stored data words one by one and apply such data words to its internal address bus. Suitable software for this is listed below, with the software being expressed in standard assembler op code for an 8080 based processor.

| LINE NUMBER | LABEL | ASSEMBLER OP CODE | COMMENTS |
|---|---|---|---|
| 0300 | RAM | EQU 2000H | OR ANY 4K BOUNDARY |
| 0350 | PROM | EQU 8000H | PROGRAMMER LOCATION |
| 0400 | PASS | EQU 250 | PROGRAMMING LOOPS |
| 0450 | SIZE | EQU | 2 FOR 512 BYTES (2704) |
|  |  |  | 4 FOR 1024 BYTES (2708) |
|  |  |  | 8 for 2048 BYTES (2716) |
| 0700 | INIT | LXI H,RAM | LOAD RAM POINTER |
| 0750 |  | INX H | (OR NOP, REFER TO TEXT) |
| 0800 |  | LXI D,PROM | LOAD FROM ADDRESS |
| 0850 |  | MVI C,PASS | LOAD NUMBER OF ADDRESS LOOPS |
| 0900 | LOOP | MOV E,M | GET DATA BYTE |
| 0950 |  | LDAX D | SEND IT TO PROGRAMMER |
| 1000 |  | INX H |  |
| 1050 |  | MOV A,H | TEST FOR END OF PROM |
| 1100 |  | ANI SIZE |  |
| 1150 |  | JZ LOOP | CONTINUE ADDRESS LOOP |
| 1200 |  | XRA H |  |
| 1250 |  | MOV H,A | RESTORE RAM POINTER |
| 1300 |  | DCR C |  |
| 1350 |  | JNZ LOOP | CONTINUE LOOP |
| 1400 |  | RET | END |

To commence programming PROM 5, adapter 1 is connected between the microprocessor and PROM 5. In particular, adapter plug 13P is inserted into processor socket 7, free pin 13-FP1 is connected to the microprocessor's Enable-Buffers signal lead, free pin 13-FP2 is connected to the microprocessor's Ready bus, and PROM 5 is inserted into adapter socket 15. Switches SW1-SW3 are manually set to provide pin compatibility in the manner described above and to place adapter 1 into a programming mode of operation. With the switches so set, contact S1C4 is grounded causing a $\overline{\text{PROG}}$ signal to be false. This in turn causes switching inverter 41 (FIG. 5) to turn on so that operating power is supplied to buffer circuit 43. Contact S1A4, on the other hand, is not grounded, and inasmuch as a pull up resistor 50 is connected to it, the $\overline{\text{READ}}$ signal is true. This enables monostables 30 and 32 to respond to their respective trigger signals. An RE signal (FIG. 3), produced at the output of an OR gate 52, is false, thereby enabling counter 37 to respond to its trigger signal.

In the course of execution of its instructions, the microprocessor causes the multibit signal carried by its internal address bus to define a sequentially selected one of the data words each time the chip select signal and the Disable signal have the appropriate logical values normally used to read a data word from a PROM. Each such time, adapter 1 increments address counter 37 to determine the location of PROM 5 which will receive the data word, propagates the defined data word through latch circuit 25 to the set of data terminals of PROM 5, and generates a program pulse (PP) to cause the data word to be entered into the location so determined. FIG. 7 indicates the points in the sequence at which times the data word is latched, the counter is triggered, and the data word is entered into PROM 5.

The standby mode of operation, to which reference was made above, is provided in the specific embodiment merely to enable to plurality of adapters to operate in parallel in connection with the same processor. As for the programming operation, any number of adapters can be operated in parallel to program a plurality of PROMs at the same time. As for verification testing, one of such parallel connected adapters at a time is placed in the read mode while the remaining are placed in standby. It will be appreciated from FIG. 3 that, in the standby mode, the RE signal is true thereby resetting counter 37. Also, owing to the position of S1P2 in the standby mode, AS18 is disconnected from both AP18 and AP20, whereby no chip select signal propagates through adapter 1 while it is in the standby mode.

Figure 6:
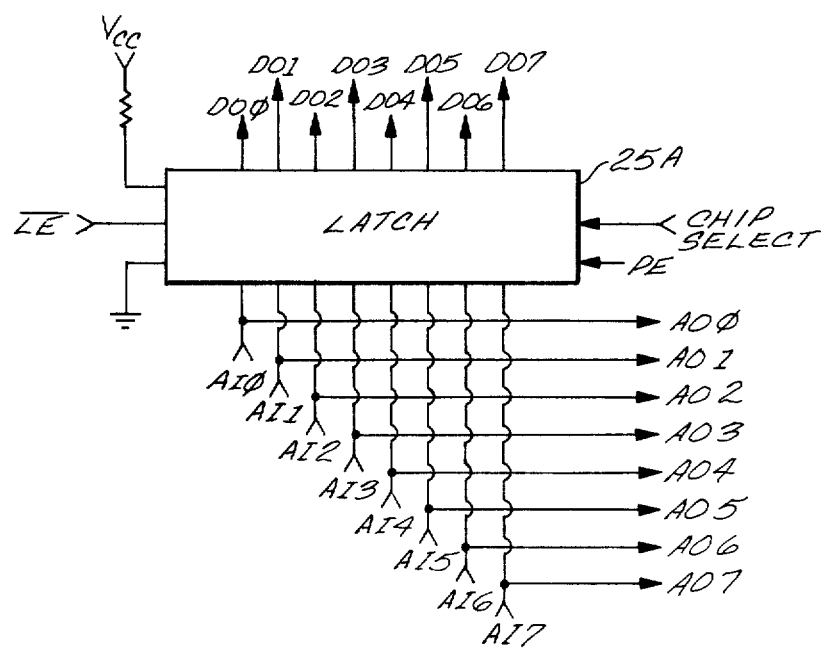
FIG. 6 is a block and schematic diagram showing an alternative arrangement used in a second embodiment of the invention.

With reference to FIG. 6, there will now be described an alternative arrangement used in a second embodiment of the invention. In general principle, the construction and operation of the second embodiment is the same as the first embodiment, the only material difference residing in the addressing means. In particular, it can be seen from FIG. 6 that AI$\phi$ through AI7 are directly connected to AO$\phi$ through AO7 respectively in the second embodiment. In other words, there is an adapter address bus connected between the adapter plug 13P and the adapter socket 15. In operation, the multiplex signal carried by this address bus alternately defines an entry address and a data word. A latch circuit, 25A, suitably an 74LS374 integrated circuit copies the data word and applies it to DO$\phi$ through DO7 so that when the subsequently defined address is provided, the program pulse can cause entry of the data word into the appropriate location. A conventional flip-flop arrangement (not shown) provides $\overline{\text{LE}}$ and PE signals to latch circuit 25A to cause it to copy the alternately supplied data words.

It will be appreciated that the foregoing specifically described circuitry is exemplary and that various modifications can be made thereto within the scope of the invention as defined in the appended claims.

I claim:

1. An adapter for use in connection with an instruction-controlled processor to form an apparatus for carrying out a programming operation to program a PROM having a plurality of locations and a plurality of terminals defining a set of address terminals and a set of data terminals, at least one of the terminals being a program control terminal, the processor having processor socket means for having a pre-programmed PROM inserted therein for use in normal operation of the processor, an internal address bus connected to the processor socket means, and reading means for use in such normal operation to read out such a pre-programmed PROM, the reading means including means for causing the internal address bus to carry a multibit signal, the encoding of which in normal operation of the processor is such as to define an address each time the processor executes a predetermined instruction, the reading means further including means for supplying timing signals used in selecting such pre-programmed PROM, the adapter comprising:

an adapter input for connecting the adapter to the processor, the adapter input including adapter plug means for temporary insertion into the processor socket means so that the multibit signal is received by the adapter from the internal address bus;

adapter socket means into which a PROM to be programmed is inserted for the programming operation; and control circuit means for entering a plurality of data words into such inserted PROM, the control circuit means including addressing means connected to the adapter socket means for applying a sequence of addresses to the set of address terminals of such inserted PROM so that each such data word is entered into a separate location, signal propagating means connected between the adapter plug means and the adapter socket means for propagating to the set of data terminals of such inserted PROM each multibit signal of a sequence of such multibit signals received from the internal address bus, and pulse generating means connected by the adapter input to receive the timing signals so as to respond to the timing signals to apply a control signal to the program control terminal of such inserted PROM to cause entry into such inserted PROM each multibit signal that is propagated from the internal address bus to the set of data terminals.

2. An adapter according to claim 1, wherein the addressing means includes a counter and means for stepping the counter to cause it to generate a sequence of addresses for application to the set of address terminals of such inserted PROM.

3. An adapter according to claim 2, wherein the signal propagating means includes an adapter data bus connected by the adapter socket means to the set of data terminals of such inserted PROM, and means connected by the adapter plug means to the internal address bus for responding to each of a sequence of addresses defined by the multibit signal by applying a data word to the adapter data bus, each such data word being a copy of at least a portion of the respective address.

4. An adapter according to claim 1, wherein the addressing means includes an adapter address bus connected between the adapter plug means and the adapter socket means for carrying a time-division multiplex signal that alternately defines an entry address and a data word, and wherein the control circuit means includes means for causing the pulse generating means to generate a program pulse when the multiplex signal defines an entry address.

5. An adapter according to claim 1, wherein the adapter input includes means for receiving operating power from the processor.

6. An adapter for converting into a PROM programmer an instruction-controlled processor which has processor socket means adapted to have inserted in it a pre-programmed PROM having a plurality of locations, a set of address terminals, a set of data terminals, a set of operating power terminals, and a control terminal, and which further has an internal address bus connected to the processor socket means and PROM reading means for causing the internal address bus to carry a multibit signal, the encoding of which in normal operation of the processor is such as to define an address each time a read instruction is executed to read a data word from such an inserted pre-programmed PROM, the PROM reading means further including means for supplying timing signals used in selecting such pre-programmed PROM, the adapter comprising:

adapter plug means for effecting a connection between the adapter and such a processor, the adapter plug means being inserted into the processor socket means of such connected processor for a PROM programming operation, whereby the adapter receives the multibit signal from the internal address bus;

adapter socket means into which a PROM to be programmed is inserted for the programming operation; and control circuit means operative in the course of execution by the processor of sequentially executed read instructions to enter a plurality of data words into such inserted PROM, the control circuit means including addressing means connected to the adapter socket means for applying a sequence of addresses to the set of address terminals of such inserted PROM so that each such data word is entered into a separate location, signal propagating means connected between the adapter plug means and the adapter socket means for propagating to the set of data terminals of such inserted PROM each multibit signal of a sequence of such multibit signals received from the internal address bus, and pulse generating means connected to receive the timing signals so as to respond thereto to apply a control signal to the control terminal to cause entry into such inserted PROM each multibit signal that is propagated from the internal address bus to the set of data terminals.

7. An adapter according to claim 6, wherein the addressing means comprises a counter and means fo stepping the counter to cause it to generate a sequence of addresses for application to the set of address terminals of such inserted PROM.

8. An adapter according to claim 6, wherein the control circuit means is arranged to carry out a signal sorting operation in the course of entering each of the plurality of data words, and wherein the signal propagation means includes register means and means operative in the course of execution by the processor of the earlier of two consecutively executed read instructions for loading a data word into the register means, the data word so loaded into the register means being a copy of at least a portion of the multibit signal then being supplied by the internal address bus, the register means having an output connected to the adapter socket means so that the data so loaded into the register means is present on the set of data terminals of such inserted PROM in the course of execution by the processor of the later of the two read instructions, and wherein the addressing means includes an adapter address bus for carrying the multibit signal to the set of address terminals of such inserted PROM.

* * * * *

UNITED STATES PATENT AND TRADEMARK OFFICE
CERTIFICATE OF CORRECTION

PATENT NO. : 4,244,032
DATED : January 6, 1981
INVENTOR(S) : DOUGLAS E. OLIVER

It is certified that error appears in the above—identified patent and that said Letters Patent is hereby corrected as shown below:

Column 5, lines 10 and 11, "AS1-3-AS17" should read -- AS13-AS17 --; line 24, "A17" should read -- AI7 --; Column 9, line 8, after "enable," "to" should read -- a --; Column 12, line 4, claim 7, line 2, "fo" should read -- for --.

Signed and Sealed this

Twenty-sixth Day of May 1981

[SEAL]

Attest:

RENE D. TEGTMEYER

Attesting Officer     Acting Commissioner of Patents and Trademarks